United States Patent [19]

Gurev

[11] 4,268,711
[45] May 19, 1981

[54] METHOD AND APPARATUS FOR FORMING FILMS FROM VAPORS USING A CONTAINED PLASMA SOURCE

[75] Inventor: Harold S. Gurev, San Rafael, Calif.

[73] Assignee: Optical Coating Laboratory, Inc., Santa Rosa, Calif.

[21] Appl. No.: 26,598

[22] Filed: Apr. 26, 1979

[51] Int. Cl.³ .......................................... H01L 31/04
[52] U.S. Cl. .................................. 136/256; 118/50.1; 204/164; 427/38; 427/84; 427/95
[58] Field of Search ...................... 427/38, 39, 82, 84, 427/93, 95; 204/164; 136/89 CC; 118/50.1

[56] References Cited

U.S. PATENT DOCUMENTS

| | | | |
|---|---|---|---|
| 3,801,355 | 4/1974 | Van Cakenberghe | 204/164 |
| 4,086,102 | 4/1978 | King | 136/89 CC |
| 4,099,986 | 7/1978 | Diepers | 136/89 CC |
| 4,123,316 | 10/1978 | Tsuchimoto | 204/164 |
| 4,138,306 | 2/1979 | Niwa | 427/39 |

OTHER PUBLICATIONS

Hecq et al., "Thin Solid Films", vol. 12, No. 2, 1972, pp. 453-456.

Primary Examiner—John H. Newsome
Attorney, Agent, or Firm—Flehr, Hohbach, Test, Albritton & Herbert

[57] ABSTRACT

Method for forming mixed oxide and/or nitride films upon the surface of an article by the use of a partially confined plasma-activated source. The plasma-activated source has a cavity in which an RF field is formed within the cavity to create a gas plasma in the cavity as gas is introduced into the cavity. The gas plasma is caused to exit from the cavity to impinge upon the surface of the article to be coated. At least one of the constituents of the film is selected as a compound vapor and is chemically reacted with at least one other constituent by utilization of the gas plasma to form the thin film on the surface of the article while the article is maintained at a low temperature. A chemical reaction takes place within the cavity itself and/or alternatively at the surface to be coated for the formation of the films.

15 Claims, 3 Drawing Figures

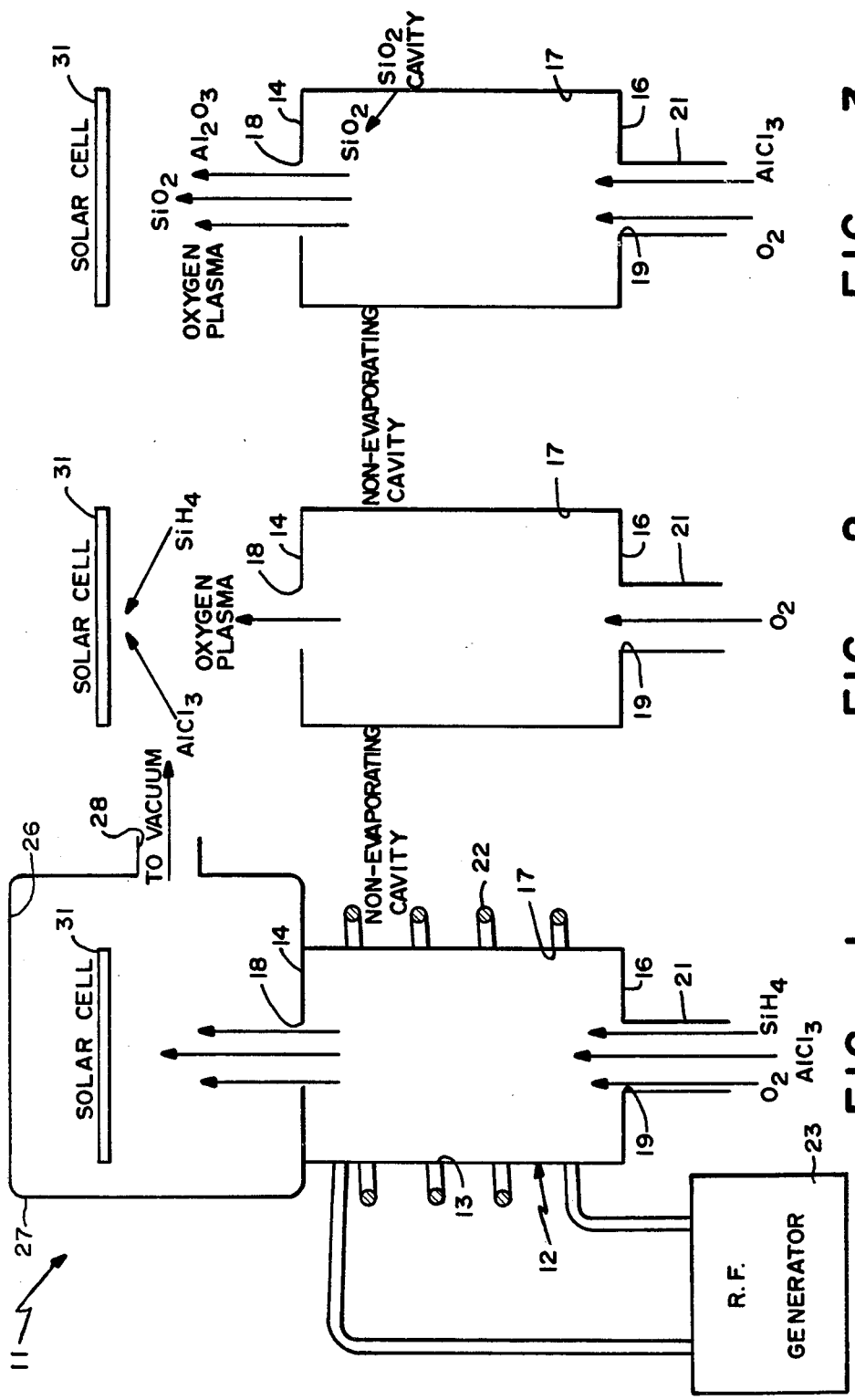

METHOD AND APPARATUS FOR FORMING FILMS FROM VAPORS USING A CONTAINED PLASMA SOURCE

This invention relates to compound thin films and a method and apparatus for their formation utilizing a contained plasma source. One application is an integral solar cell cover, another is the low temperature deposition of conductive, transparent oxides.

Solar cell covers have heretofore been provided for protecting solar cells from high energy particle radiation in space. Such solar cells covers have typically been comprised of thin sheets of fused silica which are cemented over the tops of the cells. In order to prevent degradation of the adhesive, it has been necessary to provide an ultra-violet light blocking filter on the cover. Covers having these capabilities are described in the U.S. application, Ser. No. 945,433, filed Sept. 25, 1978.

For space power systems there is a continuing need for lightweight solar cell arrays. As the requirements for power per satellite increase, there is an increasing need for lighter weight arrays. Although at the present time it is possible to manufacture relatively thin (i.e., a 2 mil solar cell having high performance), there does not now exist a light weight cover with proven performance for protecting the light weight solar cell. Unless a new type solar cell cover is developed, future satellite programs may be faced with the prospect of cementing a 4 to 6 mil thick cover to a 2 mil thick cell in order to provide the required cell lifetime. Numerous attempts have heretofore been made to deposit covers directly to the surface of the solar cell. However, no cost effective manufacturing process has emerged which provides a real solution to the problem. There is, therefore, a need for a new and improved integral solar cell cover.

In general, it is an object of the present invention to provide an improved integral solar cell cover which has a coefficient of expansion which substantially is similar to that of the solar cell.

Another object of the invention is to provide an integral solar cell cover of the above character which can be formed to a thickness of up to 100 μm.

Another object of the invention is to provide a method and apparatus for forming mixed oxide and/or nitride film using a contained plasma source.

Another object of the invention is to provide a method and apparatus of the above character in which the films are formed of a composition selected from the Al—Si—O—N quaternary system.

Another object of the invention is to provide a method and apparatus of the above character in which the thin films are formed of materials selected from the Sb—Sn—O system.

Another object of the invention is to provide a method and apparatus of the above character in which the materials for the thin films are selected from the In—Sn—O system.

Another object of the invention is to provide a method and apparatus for the formation of an integral solar cell cover using a contained plasma source.

Another object of the invention is to provide a method and apparatus of the above character in which the integral solar cell cover is formed from mixed oxide/nitride films of a composition selected from the Al—Si—O—N quaternary system.

Another object of the invention is to provide a method and apparatus of the above character in which one or more of the constituents is introduced into the apparatus as a compound vapor and chemically reacted to the desired oxide or nitride at one or the other or at both of two sites, one within the plasma activated source and the other at the surface of the solar cell substrate on which the integral cover is to be formed or at both sites.

Another object of the invention is to provide a method and apparatus of the above character in which the integral solar cell can be formed on the solar cell substrate at a temperature which is below 400° C.

Another object of the invention is to provide a method and apparatus of the above character in which the integral solar cell can be formed very rapidly.

Another object of the invention is to provide a method and apparatus of the above character which is particularly adapted for use in forming thin films in roll coatings with minimal heating of the substrate.

Another object of the invention is to provide a method and apparatus of the above character in which erosion of the source is unnecessary.

Another object of the invention is to provide a method and apparatus of the above character in which a chemical reaction takes place in the formation of the integral solar cell cover.

Another object of the invention is to provide a method and apparatus of the above character in which it is possible to provide continuous runs.

Additional objects and features of the invention will appear from the following description in which the preferred embodiments are set forth in detail in conjunction with the accompanying drawings.

FIG. 1 is a schematic illustration of an apparatus incorporating the present invention and showing one method for forming an integral solar cell cover by deposition of silicon dioxide and aluminum oxide by a plasma-activated in-cavity oxidation of a silicon compound and an aluminum compound.

FIG. 2 is a schematic illustration similar to FIG. 1 showing the formation of an integral solar cell cover by deposition of silicon dioxide and aluminum oxide by external oxidation of a silicon compound and an aluminum compound in a plasma-activated oxygen discharge.

FIG. 3 is another schematic illustration similar to FIGS. 1 and 2 showing a method and apparatus for forming an integral solar cell cover by the deposition of silicon dioxide and aluminum oxide by exporation of solid silicon dioxide in a plasma-activated in-cavity oxidation of an aluminum compound.

In the method which is utilized for forming a mixed oxide/nitride film from materials selected from the Al—Si—O—N quaternary system on articles such as solar cells by use of a plasma-activated source, the source is provided with a cavity and with means for generating a radio frequency field within the cavity. At least one of the constituents or chemical elements for the film is supplied from a compound vapor. This compound vapor is chemically reacted with at least one other constituent or chemical elements to form the film with the temperature of the article being maintained at a temperature of less than approximately 400° C.

The apparatus 11 having a contained plasma source incorporating the present invention as shown in FIG. 1 is similar to plasma activated sources such as those disclosed in U.S. Pat. Nos. 3,801,355 and 3,922,214. It is provided with a container 12 provided with a side wall 13 and top and bottom walls 14 and 16. Thus, as shown, the container 12 can be in the form of a closed end cylinder which forms a cylindrical cavity 17. The container or cylinder 12 is provided with a top opening 18 through which the plasma is discharged as hereinafter described. It is also provided with a bottom hole 19 which is connected to piping 21 which is utilized for conducting selected gases into the cavity 17.

The container 12 is formed of material so that it will serve as a non-evaporating cavity, that is, it will not be evaporated by the plasma which is formed in the cavity. The material which is utilized is an insulating material which has relatively high melting and boiling points. By way of example, the container or cylinder 12 can be formed of a boron nitride which has very high melting and boiling points so that it is very difficult to evaporate the boron nitride from the wall or to deform the cavity shape. It has been found that fused quartz forms a relatively inexpensive satisfactory material for the formation of the cavity for low power plasmas.

Radio frequency energy is introduced into the cavity in a suitable manner such as by capacitive coupling or inductive coupling well known to those skilled in the art. Thus, there has been provided a helically wound induction coil 22 which surrounds the cylindrical container 12 and which is connected to a suitable source 23 of RF power. By way of example, the RF source 23 can have a power capability of 5 to 6 KW at a frequency of 13.6 MHz. By providing a relatively low power, as for example a $1\frac{1}{2}$ KW from the RF generator to the coil 22, it is possible to operate the plasma generator shown in FIG. 1 without causing evaporation of the silicon dioxide of which the cavity is formed whereby the silicon dioxide or fused silica cavity serves as a non-evaporative cavity.

A vacuum chamber 26 is formed by housing 27. The housing 27 is provided with an opening 28, which is connected to a suitable source of vacuum (not shown) for evacuating the chamber 26 and also for evacuating the cavity 17 provided within the container 12. The housing 27 can be such a size so that the entire container 12 can be mounted therein or alternatively the housing 27 can be mounted or associated with the container 12 in such a way that the chamber 26 is in communication with the cavity 12 through the opening 18 provided in the container 12.

Means (not shown) is provided within the housing 27 to permit the introduction of one or more solar cells 31 on which integral solar cell cover is to be provided. Such solar cells 31 are of a conventional type and will not be described in detail.

In utilizing the apparatus which is shown in FIG. 1 in order to provide a mixed oxide and/or nitride thin film to form an integral solar cover for the solar cell 31, materials are selected from the Al—Si—O—N quaternary system. One or more constituents or chemical elements are introduced into the apparatus as a compound vapor and are chemically reacted to the required oxide or nitride within the plasma activated source or at the solar cell substrate while maintaining the solar cell substrate at a temperature which is below 400° C. Thus, as shown in FIG. 1, aluminum trichloride ($AlCl_3$) and silane ($SiH_4$) are introduced with oxygen ($O_2$) as a mixed gas through the piping 21 and introduced into the cavity 17. Operation of the RF power source 23 creates a radio frequency field within the cavity 17 to ionize the gas within the cavity to create a plasma. The plasma causes a chemical reaction to take place within the cavity so that the silane and the aluminum trichloride are oxidized. The silicon and the aluminum-containing products are in the vapor form and will pass with an oxygenplasma stream through the opening 18 into the chamber 26 so that they will strike the bottom side or surface of the solar cell cover 31. As the silicon and the aluminum-containing compound vapors in combination with the activated oxygen strike the solar cell or substrate, they will deposit a mixed film of silicon dioxide ($SiO_2$) and aluminum oxide ($Al_2O_3$) with the oxygen plasma aiding the ensuring that the materials which are deposited upon the solar cell are fully reacted, or in other words, are in fully oxidized conditions at the time of deposition. The pressure differential (the pressure in the chamber 26 is less than in the cavity 13) makes possible a sustained plasma reaction in the high pressure region within the source while maintaining substantially collision free paths for the molecules in the vapor stream to the substrate.

When the materials for the combination of chemical reactions are selected such that premature thermal decomposition and solid product deposition will not occur within the cavity nor within the gas supply piping 21, the length of time that the apparatus can operate in a steady state condition would be substantially unlimited. Therefore, it is possible to run such apparatus continuously or for long periods of time which particularly lends itself to continuous operations such as roll coating.

Although the apparatus has been described in conjunction with the providing of integral covers on silicon solar cells, the same apparatus can be utilized for placing covers on gallium arsenide (GaAs) in solar cells. In order to prevent degradation of the solar cells or the substrates, deposition temperatures will be such that the substrate temperatures will be maintained below 400° C. If desired, various deposition parameters can be varied such as the ratio of the reactant gases, the total reactant gas pressure and the RF power. It is desirable to match closely as possible the thermal expansion of the cover to the thermal expansion of the substrate. In changing from a silicon substrate to a gallium arsenide substrate, it will be necessary to modify the reactant gas ratio to favor the deposition of a mixture which has a higher coefficient of thermal expansion. For example, in the aluminum oxide ($Al_2O_3$) and silicon dioxide ($SiO_2$) film, matching to a gallium arsenide substrate will result from an increase in the $AlCl_3$ $SiH_4$ ratio to promote the deposition of a more aluminum-rich glass.

During the deposition of such materials and as they are modified to match the semiconductor substrates thermomechanically, it is desired to deposit simultaneously on witness plates to verify that the cover layer transparency has been maintained.

The integral solar cell covers can be deposited to the desired thickenss, for example, in the order of several mils or even thicker, to provide the desired radiation protection.

It should be appreciated that although the apparatus and method has been described in conjunction with FIG. 1, that the materials used could be introduced in a vapor form. It also should be appreciated that it would be possible to form an aerosol of the liquid and to form a gas in the plasma within the cavity. Alternately, a liquid or powder compound could be introduced into the cavity and evaporated at the relativey low power limits of the source without evaporating the container forming the cavity.

Another embodiment of the invention is shown in FIG. 2 in which the apparatus is very similar to that shown in FIG. 1 with the exception that certain portions as, for example, the vacuum chamber have not been shown. In this embodiment of the invention, oxygen and gas or an oxygen containing gas mixture is introduced through the piping 21 into the cavity 17 wherein an oxygen plasma is formed and discharged through the top opening 18 so the oxygen comes into contact with the bottom side of the solar cell 31. At the same time one or more of the constituents selected in connection with the embodiment shown in FIG. 1 are introduced as reactive gases through an auxiliary nozzle (not shown) which is located outside of the cavity 17 but within the housing forming a vacuum chamber and adjacent the surface of the substrate or solar cell which is to be covered. The oxygen plasma which is generated within the source then chemically reacts with the vapors at or near the surface of the substrate causing them to decompose or to oxidize to form a mixed film of the materials in the same manner as hereinbefore described in conjunction with FIG. 1 to provide a cover of the solar cell 31.

It should be appreciated that active species other than oxygen can be utilized such as nitrogen, ammonia, sulfur containing compounds to form oxides, nitrides and sulfides within the scope of the present invention. It also should be appreciated that in place of silane in the method shown in conjunction with FIG. 1, it may be desirable to utilize a different material because of the tendency of silane, which is very reactive with oxygen, to form $SiO_2$ powder within the cavity which could possibly close up the top opening 18. To avoid such a problem, it is only necessary to select a less reactive silicon compound such as tetraethyl orthosilicate (TEOS) $(C_2H_5O)_4Si$.

It also should be appreciated that apparatus can be utilized for generating a plasma using an inert gas such as argon or helium with the principal disadvantage being a slower process because of the coupling geometry in the gas flow. When an inert gas plasma is utilized, the reactive agents are supplied in vapor form. In both of the embodiments of the apparatus shown in FIGS. 1 and 2, it can be seen that a non-evaporating type cavity is utilized.

In another embodiment of the invention which is shown in FIG. 3, an evaporating type cavity is utilized. Thus, fused quartz ($SiO_2$) is selected with higher power being provided in the formation of the plasma within the cavity to cause evaporating of the $SiO_2$ within the walls of the cavity. In addition, auxiliary gases are supplied through the piping into the cavity 17, thus as shown, oxygen and aluminum trichloride are introduced and gas is formed in the cavity which is combined with the evaporating of the solid $SiO_2$, so that there is provided in the cavity oxidation of the aluminum compound to provide the aluminum oxide ($Al_2O_3$) and the $SiO_2$ which passes through the opening 18 with the oxygen plasma to impinge upon the bottom surface of the solar cell 31 to form a mixture of the silicon dioxide and the aluminum oxide in the manner hereinbefore described. This apparatus has a disadvantage in that the container 12 forming the cavity 17 must be periodically replaced as the silicon dioxide is evaporated.

In order to avoid replacement of the container 12 formed in the cavity, silicon dioxide can be introduced as a powder into the plasma to cause vaporization of the same, making possible a continuous feed of the silicon dioxide powder into the cavity. Alternatively, two materials can be utilized in the formation of the container 12 making the cavity so that both materials could be evaporated by the formation of a plasma within the cavity. In such a situation it would be desirable to select two materials which have vapor pressures which are relatively close together at a different temperature.

In the embodiment of the apparatus shown in FIGS. 1, 2 and 3, the RF coils have been shown surrounding the container 12 formed in the cavity 17. It should be appreciated that if desired, RF coils can be provided at a different location, as for example, below the container 12. When this is the case, a flux concentrator (not shown) well known to those skilled in the art can be utilized for transferring flux to the level of the cavity to form the plasma hereinbefore described.

From the foregoing it can be seen that it has been possible to deposit integral solar cell covers whose composition falls in the Al—Si—O—N quaternary system. Normally, the coating compositions are selected on the basis of optical transmittance and thermo-mechanical compatibility with the substrate. A table of the coefficients of expansion are set forth below:

TABLE I

| Material | Coeff. of Thermal Exp. |
|---|---|
| | ppm/°C. |
| Si | 4.2 |
| $SiO_2$ (fused silica) | 0.5 |
| $Al_2O_3$ | 8.0 |
| $Si_3N_4$ | 2.69 |
| AlN | 4.89 |

A composition can be selected from the $SiO_2+Si_3N_4$, $SiO_2+Al_2O_3$ or $AlN+Si_3N_4$ systems. Starting materials employed can include hydrides (i.e., triethylaluminum). The plasma-activated source, as hereinbefore described, is employed to deposit these selected materials to provide mixed films which are fully reacted at high rates. As hereinbefore pointed out, to obtain the desired film composition, one or more of the constituents is introduced into the apparatus as a compound vapor and chemically reacted to the required oxide or nitride either within the solar cell or at the solar cell substrate. Ths solar cell substrate can be readily maintained at a temperature below 400° C. so that its performance will not be degraded by the application of the integral solar cell cover. Because low temperatures can be maintained on the substrate, the method apparatus particularly lends itself to continuous roll coating on sheet material which cannot withstand high temperatures.

The method and apparatus hereinbefore described have a number of advantages in the formation of thin film coatings. In general, low deposition temperatures can be utilized to permit coating on substrates such as plastics which cannot withstand high heat, as for example, coating temperatures more than approximately 100-150° C. The rate of coating with the present method and apparatus is significantly higher than that which can be obtained by sputtering. The plasma source can be used continuously by the use of a non-evaporating cavity or by supplying powdered material to the cavity.

In addition, it should be appreciated that there are a number of other applications in which the method and apparatus can be used. Among the most significant are the deposition of conducting oxides as, for example, tin oxide ($SnO_2$) or indium oxide ($In_2O_5$) and particularly conductive mixtures of oxides selected from the indium-tin-oxide (ITO) (In—Sn—O) and antimony-tin-oxide (Sb—Sn—O) systems. The method and apparatus hereinbefore disclosed in connection with the use of materials selected from the Al—Si—O—N quaternary system can be utilized with materials selected from the In—Sn—O and Sb—Sn—O systems. Examples of how the materials selected from these latter systems would be utilized are set forth below:

| Cavity | Reactant Gases | Introduction point of reactant gases | Deposited Film |
| --- | --- | --- | --- |
| Non-evaporating | $SnCl_4$ or $Sn(C_2H_5)_4$, $In(CH_3)_3$ | Through source | ITO |
| Non-evaporating | Same | External-near substrate | ITO |
| Tin-oxide evaporating | $In(CH_3)_3$ | External or through source | ITO |

Other reactant gas sources for use with tin and antimony include the volatile halides or a wide range of organometallic compounds. For indium, the choice of vapors is limited to organometallics because the known halides are not sufficiently volatile.

What is claimed is:

1. In a method for forming a mixed oxide and/or nitride solid coating on the surface of an article by use of a contained plasma source having a cavity and means for generating an RF field within the cavity, the steps supplying a compound vapor which is formed independent of evaporation of the cavity, supplying a gas to the cavity to create a gas plasma within the cavity using the gas supplied to the cavity and causing the gas plasma to exit from the cavity independent of externally generated magnetic fields and to impinge upon the surface of the article to be coated, forming the solid coating on the surface of the article by chemical reaction of the compound vapor and the gas plasma selecting at least one of the chemical elements of the film to be supplied from a compound vapor and chemically reacting the compound vapor with at least one other chemical element of the film by utilizing at least some of the gases.

2. A method as in claim 1 where the chemical elements for the film are selected from Al—Si—O—N quaternary system.

3. A method as in claim 1 wherein the chemical elements for the film are selected from the In—Sn—O system.

4. A method as in claim 1 wherein the chemical elements are selected from the Sb—Sn—O system.

5. A method as in claim 1 wherein the temperature of the article is maintained at a temperature of less than 150° C.

6. A method as in claim 2 wherein the gas plasma is oxygen.

7. A method as in claim 2 wherein the gas plasma is nitrogen.

8. A method as in claim 2 wherein the chemical elements introduced as a compound vapor are introduced into the cavity so that a chemical reaction takes place within the cavity.

9. A method as in claim 2 wherein the chemical elements introduced as a compound vapor are introduced at the surface of the article to be coated.

10. In an apparatus for forming a mixed oxide and/or nitride solid film on the surface of an article by the use of a contained plasma source, container means defining a cavity and having an exit opening therein in communication with the cavity, a housing coupled to the container and forming a chamber which is in communication with the exit opening in the container, means for supplying a vacuum to the chamber in the housing and the cavity within the container, said housing being formed to receive the article on which the film is to be formed, means for establishing an RF field in the cavity, means for introducing a gas into the cavity for creating a gas plasma to create a higher pressure in the cavity whereby the gas plasma is discharged independent of externally generated magnetic fields through the exit opening and impinges upon the surface to be coated and means for supplying a vapor which is formed independent of evaporation of the cavity and causing it to chemically react with the gas plasma to provide a mixture forming a solid film on the surface of the article.

11. Apparatus as in claim 10 wherein the means for supplying the selected compound is positioned to introduce the selected compound in vapor form into the cavity.

12. An apparatus as in claim 10 wherein the means for supplying the selected compound is positioned to introduced the selected compound at the surface of the article to be coated.

13. Apparatus as in claim 10 wherein said means for introducing a selected compound includes means for introducing first and second chemical elements in a gaseous form into the cavity.

14. Apparatus as in claim 10 wherein said means for introducing a selected compound includes means for introducing first and second chemical elements in gaseous form at the surface of the article.

15. In a solar cell construction having an integral cover, a solar cell, a film formed integral thereon covering the surface of said cell and formed of a composition selected from $SiO_2+Si_3N_4$, $SiO_2+Al_2O_3$ or $AlN+Si_3N_4$ systems, said composition having a coefficient of expansion similar to that of the solar cell.

* * * * *

UNITED STATES PATENT AND TRADEMARK OFFICE
CERTIFICATE OF CORRECTION

PATENT NO. : 4,268,711
DATED : May 19, 1981
INVENTOR(S) : H. Gurev

It is certified that error appears in the above-identified patent and that said Letters Patent are hereby corrected as shown below:

Column 6, line 68, delete "$(In_2O_5)$" and substitute therefor --$(In_2O_3)$--.

Claim 1, column 7, line 35, before "supplying" insert --of--.

Claim 1, column 7, line 44, before "selecting" insert --by--.

Claim 1, column 7, line 45, delete "film" and substitute therefor --coating--.

Claim 1, Column 7, line 48, delete "film" and substitute therefor --coating--.

Claim 1, column 7, line 48, after "gases", insert --of the gas plasma--.

Claim 2, column 7, line 49, delete "where" and substitute therefor --wherein--.

Signed and Sealed this

First Day of December 1981

[SEAL]

Attest:

GERALD J. MOSSINGHOFF

Attesting Officer    Commissioner of Patents and Trademarks